United States Patent [19]
Itoh

[11] Patent Number: 5,291,433
[45] Date of Patent: Mar. 1, 1994

[54] SEMICONDUCTOR MEMORY WITH LEAK-RESISTANT BIT LINES

[75] Inventor: Hideki Itoh, Tokyo, Japan

[73] Assignee: Oki Electric Industry Co., Ltd., Tokyo, Japan

[21] Appl. No.: 943,891

[22] Filed: Sep. 11, 1992

[30] Foreign Application Priority Data

Sep. 13, 1991 [JP] Japan .................................. 3-234906

[51] Int. Cl.⁵ .............................................. G11C 5/06
[52] U.S. Cl. .......................................... 365/63; 365/51; 257/767
[58] Field of Search ................... 365/63, 51, 203, 149, 365/206, 214; 257/767, 765, 771

[56] References Cited

U.S. PATENT DOCUMENTS

| | | | |
|---|---|---|---|
| 4,931,845 | 6/1990 | Ema | 257/767 |
| 4,937,652 | 6/1990 | Okumura | 257/761 |
| 5,051,812 | 9/1991 | Onuki | 257/761 |

OTHER PUBLICATIONS

Kikuda et al., "Optimized Redundancy Selection Based on Failure-Related Yield Model for 64Mb DRAM and Beyond," *Digest of Technical Papers*, sec. TAM 6.1, pp. 104–105 (1991 IEEE International Solid-State Circuits Conference).

*Primary Examiner*—Eugene R. LaRoche
*Assistant Examiner*—A. Zarabian
*Attorney, Agent, or Firm*—Edward D. Manzo

[57] ABSTRACT

Each of the bit lines of a semiconductor memory has an intermediate section with low electrical resistance and low electromigration resistance. If the bit line is shorted to a word line, during burn-in the electrical resistance of the intermediate section increases because of electromigration, thereby preventing excess current from leaking through the shorted bit line during subsequent use.

13 Claims, 5 Drawing Sheets

SEMICONDUCTOR MEMORY WITH LEAK-RESISTANT BIT LINES

BACKGROUND OF THE INVENTION

This invention relates to the bit lines of a semiconductor memory such as a dynamic random-access memory (DRAM) or static random-access memory (SRAM).

Large-scale semiconductor memories are often designed with a certain amount of redundancy, so that if a fault is detected when the memory is tested during manufacture, the faulty part can be replaced by a redundant part and the memory can still be used. One fault that tends to occur is a short circuit between a bit line and a word line. In this case the shorted bit line is replaced by a redundant bit line.

Since the faulty bit line remains shorted to the word line, however, if the bit line is precharged to a different potential from the word line in the standby state, as is commonly the case, current leaks through the short circuit, degrading the current dissipation characteristics of the memory. Not infrequently, the memory exceeds its standby current leakage tolerance and has to be discarded even though the faulty bit line has been replaced.

Proposed methods of solving this problem include holding both bit and word lines at the ground potential in the standby state, and increasing the resistance of the bit-line or word-line material. These proposed solutions are unsatisfactory because they reduce the memory access speed. Another unsatisfactory solution is to add circuit elements to disable the precharging of faulty bit lines; the drawback of this approach is that it requires extra circuit area.

SUMMARY OF THE INVENTION

It is accordingly an object of the present invention to reduce standby current leakage when a bit line is shorted to a word line, without reducing access speed or increasing circuit area.

A semiconductor memory according to the present invention comprises a plurality of bit lines, a plurality of word lines, and an equalizer for precharging the bit lines to a fixed potential. Each bit line has a first section crossing the word lines, a second section coupled to the first section, and a third section coupled to the second section and the equalizer. The second section has a lower electromigration resistance than the first and third sections. If a bit line is shorted to a word line, the second section of that bit line acquires a high electrical resistance due to electromigration during burn-in.

DETAILED DESCRIPTION OF THE INVENTION

Several embodiments of the invention will now be described with reference to the attached drawings. The drawings are shown for illustrative purposes and do not restrict the scope of the invention, which should be determined solely from the appended claims.

First a brief description of DRAM and SRAM memory circuits will be given to illustrate the general setting in which the invention may be used and to show more clearly the problem that the invention solves. In this description the word 'high' will refer to a power supply potential (VCC) and the word 'low' to a ground potential.

Figure 1:
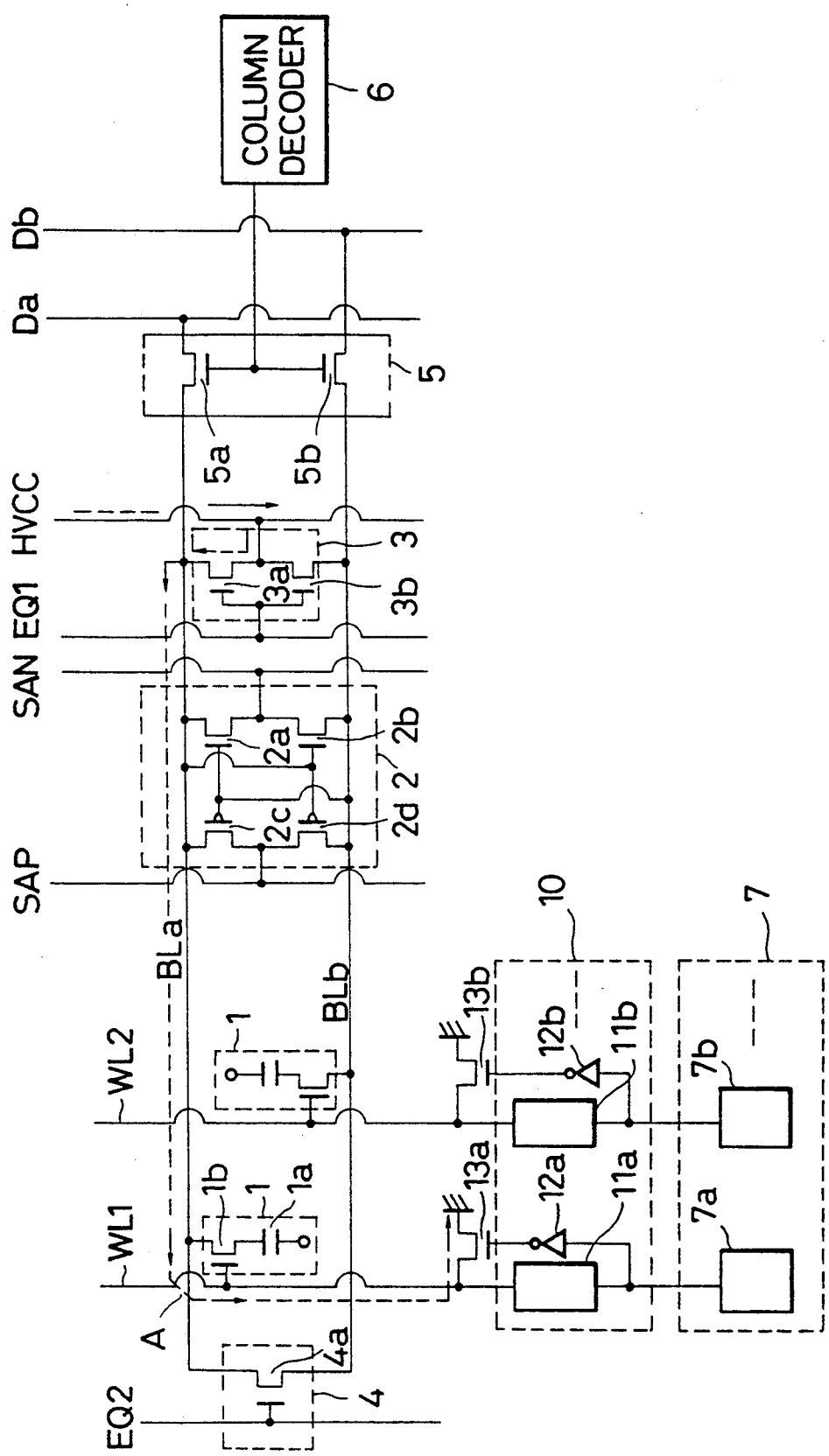
FIG. 1 is a partial schematic diagram of a DRAM.

Referring to FIG. 1, a DRAM has a plurality of parallel bit lines BLa, BLb, . . . and a plurality of parallel word lines WL1, WL1, . . . that cross the bit lines. Memory cells 1, each consisting of a storage capacitor 1a and a transistor 1b, are disposed at the intersections of the bit lines and word lines. Each memory cell 1 is coupled to one bit line and one word line.

The bit lines are paired, bit lines BLa and BLb forming one pair in the drawing. A pair of bit lines such as BLa and BLb is connected to a sense amplifier 2 comprising cross-coupled transistors 2a, 2b, 2c, and 2d. The sense amplifier 2 is coupled to two signal lines SAP and SAN which are driven to the high and low potentials, respectively.

The bit lines BLa and BLb are also connected to a first equalizer 3 comprising transistors 3a and 3b, and a second equalizer 4 comprising a transistor 4a. The first equalizer 3 is the equalizer mentioned in the summary of the invention. The transistors in the equalizers 3 and 4 are turned on and off by signals EQ1 and EQ2. When EQ1 is active, the first equalizer 3 couples bit lines BLa and BLb to a signal line designated HVCC, which is held at one-half the power-supply potential (VCC). When EQ2 is active, the second equalizer 4 couples the bit lines BLa and BLb to one another.

The bit lines BLa and BLb are further coupled via a transfer gate 5 comprising transistors 5a and 5b to a pair of data lines Da and Db. The transfer gate 5 is controlled by a column decoder 6.

A row decoder 7 comprising decoding circuits 7a, 7b, . . . controls a word-line driver circuit 10 comprising drive circuits 11a, 11b, . . . and inverters 12a, 12b, . . . The outputs of the drive circuits 11a and 11b drive the word lines WL1 and WL2. The outputs of the inverters drive transistors 13a and 13b that couple the word lines WL1 and WL2 to the ground potential.

A DRAM usually comprises many more than the two bit lines, word lines, memory cells and other components shown in FIG. 1, but FIG. 1 suffices to illustrate the basic DRAM circuit configuration. Next the operation will be briefly described.

In the standby state the signals EQ1 and EQ2 are active and the bit lines BLa and BLb are identically precharged to one-half the power-supply potential. The outputs of the column decoder 6 and row decoder 7 are all inactive, so the outputs of the inverters 12a and 12b turn on the transistors 13a and 13b, resetting the word lines WL1 and WL2 to the ground potential.

When the memory is accessed by reading, for example, the signals EQ1 and EQ2 are switched off, the row decoder 7 selects one of the word lines, and the word-line driver circuit 10 drives that word line to the active state (in this case the high state). If word line WL1 is driven, for example, then transistor 1b turns on and the charge in capacitor 1a is transferred to bit line BLa, resulting in a slight potential difference between the bit lines BLa and BLb. This potential difference is amplified by the sense amplifier 2, so that one of the two bit lines goes to the high level and the other to the low level. The column decoder 6 turns on the transfer gate 5, transferring the logic levels on the bit lines BLa and BLb to the data lines Da and Db.

In FIG. 1, short circuits are apt to occur at points such as A where a bit line crosses a word line. If a short circuit occurs at point A, then in the standby state current will leak from the HVCC signal line to ground on the path indicated by the dashed arrow line, leading through the equalizer 3, the bit line BLa, the short circuit at point A, the word line WL1, and the transistor 13a. A typical value for such short-circuit leakage current is five hundred microamperes, which is much higher than the normal standby leakage current.

The short circuit at point A also renders the bit line BLa unusable for read and write access. The manufacturer detects the bit-line defect when testing the memory device, and by reconfiguring the column decoder 6 replaces the bit line (and its associated memory cells and other circuits) with a redundant bit line not shown in the drawing. This reconfiguration process does not remove the current leakage path indicated by the dashed line through point A.

Figure 2:
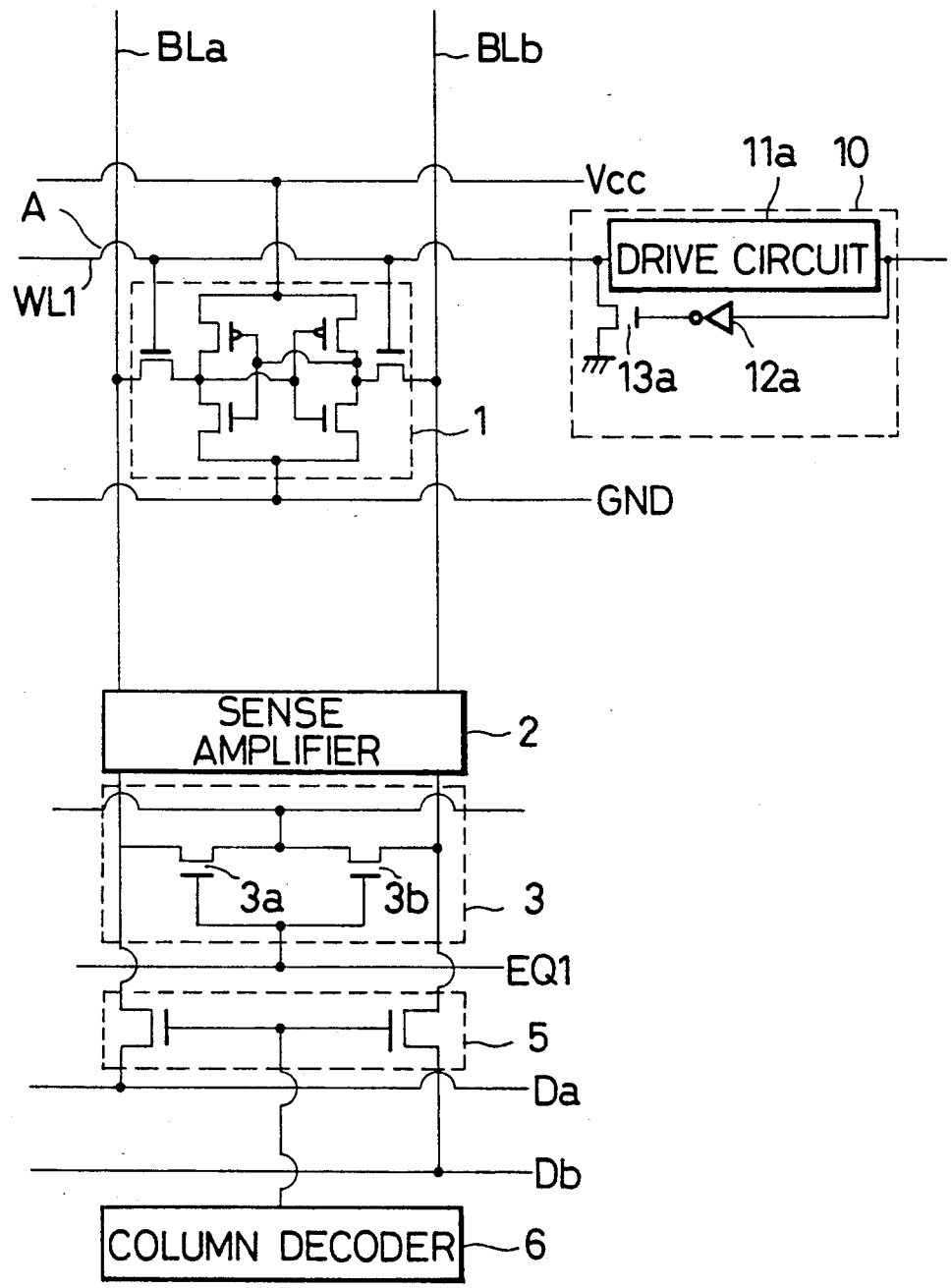
FIG. 2 is a partial schematic diagram of an SRAM.

FIG. 2 is a schematic diagram of an SRAM. Components and signal lines analogous to those in FIG. 1 are indicated with the same reference numerals and symbols, and detailed descriptions will be omitted. The main difference is in the internal structure of the memory cell 1, which is now configured as a flip-flop comprising six transistors. As in FIG. 1, if there is a short circuit between bit line BLa and word line WL1 at point A, in the standby state considerable current will leak from the HVCC signal line through the bit line BLa, the short circuit at point A, the word line WL1, and the transistor 13a to ground. The defective bit line will be replaced with a redundant bit line, but again this will not eliminate the current leakage.

The present invention provides a novel type of bit line that prevents the current leakage indicated in FIGS. 1 and 2, as will be described next. The invention is of course not limited to use in the specific memories shown in FIGS. 1 and 2; it can be applied in a wide variety of memory circuits.

Figure 3:
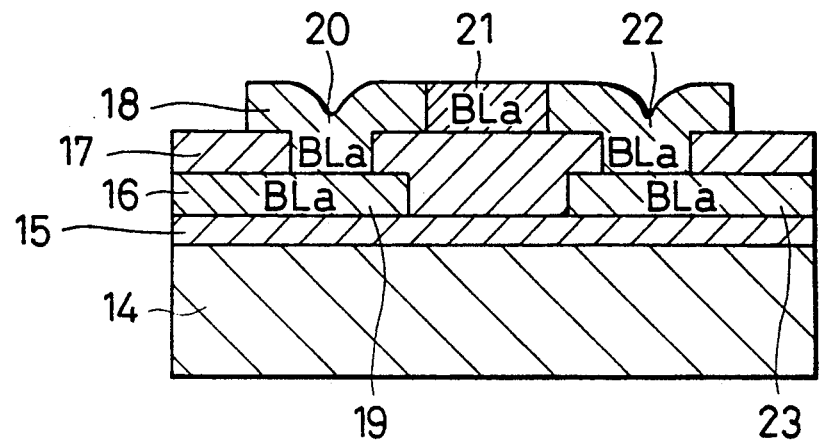
FIG. 3 is a partial sectional view of a semiconductor memory with novel bit lines.

FIG. 3 is a sectional view of part of a semiconductor memory employing novel bit lines. The memory comprises a semiconductor substrate 14 on which transistors such as those shown in FIGS. 1 and 2 are formed by well-known methods. (The transistors are not indicated in FIG. 3.) The substrate 14 and transistors are sequentially covered by a first insulating layer 15 such as a layer of silicon dioxide, a first metalization layer 16 comprising an aluminum alloy, a second insulating layer 17, and a second metalization layer 18 also comprising an aluminum alloy. The first metalization layer 16 and second metalization layer 18 are patterned to form interconnections.

Among the interconnections formed in the metalization layers 16 and 18 are the bit lines shown in FIGS. 1 and 2. The bit lines travel mainly in the first metalization layer 16 but also partly in the second metalization layer 18. FIG. 3 shows a portion of bit line BLa, comprising a first part 19 disposed in the first metalization layer 16, a second part 20, third part 21, and fourth part 22 all disposed in the second metalization layer 18, and a fifth part 23 again disposed in the first metalization layer 16. The portion of the bit line BLa shown in FIG. 3 is located between the memory cells 1 and the equalizer 3 in FIG. 1 or 2; accordingly, it is disposed between the first equalizer 3 and all of the word lines.

The first part 19 of the bit line BLa crosses the word lines in FIG. 1 or 2. (The point of crossing is not shown in FIG. 3 but lies further to the left.) The second part 20 makes contact with the first part 19 through a hole in the second insulating layer 17. The third part 21 is contiguous with the second part 20 and fourth part 22. The fourth part 22 makes contact with the fifth part 23 through another hole in the second insulating layer 17. The fifth part 23 is coupled to the first equalizer 3 in FIG. 1 or 2. The second insulating layer 17 separates the first part 19 from the fifth part 23 so that they are electrically coupled only through the second, third, and fourth parts 20, 21, and 22.

The aluminum alloy of which the bit line BLa is made has low electrical resistivity, and the third part 21 is processed to lower its resistance to electromigration. Electromigration is a transport phenomenon in which a material conducting a direct current moves under the influence of electron momentum. Electromigration is generally considered a problem in semiconductor devices, but in this invention it is used to advantage. Susceptibility to electromigration varies with the grain size of the conducting material; small grains move more easily than large grains. The third part 21 comprises crystalline aluminum with a fine crystal grain size, not exceeding half the line width of the bit line BLa.

A fine crystal grain size and low electromigration resistance can be induced easily by a variety of methods. One method is to use ion implantation to render the aluminum alloy in the third part 21 amorphous, then to apply a short heat treatment, at 500° C. to 600° C. for five to thirty seconds for example.

Each bit line has the structure shown in FIG. 3. A bit line thus consists of three different sections: a first section, comprising the first part and second parts 19 and 20 in FIG. 3, that crosses the word lines; a second section, comprising the third part 21 in FIG. 3, that has a lowered electromigration resistance; and a third section, comprising the fourth and fifth parts 22 and 23 in FIG. 3, that is coupled to the equalizer. Normally all three sections have low electrical resistance, but if a bit line is shorted to a word line, its second section acquires a high electrical resistance as explained next.

After the semiconductor memory has been tested and any defective bit lines replaced with redundant bit lines, the memory is subjected to a so-called burn-in test in which it is driven cyclically at a high electrical bias in a high-temperature atmosphere. During burn-in, electromigration occurs in the third part 21 of each bit line, increasing its electrical resistance. The rate of increase is an exponential function of the temperature and is proportional to the P-th power of the current density, where P is a number between 1.5 and two. If the bit line BLa is shorted to a word line, approximately one hundred times the normal current flows through it to ground, so the electrical resistance of its third part 21 increases about one thousand to ten thousand times as much as the electrical resistance of the third part 21 of other, normal bit lines. By the end of burn-in, the shorted bit line BLa has acquired an extremely high electrical resistance, while the resistance of normal bit lines has been scarcely affected.

When the memory is tested after burn-in, little or no current will be able to flow through any short-circuited bit lines. The benefit to the manufacturer is thus a higher manufacturing yield: fewer devices will be rejected because they exceed their standby leakage current tolerance. The benefit to the user is lower standby power dissipation. These benefits are realized without any sacrifice of memory access speed, because the low resistance of normal bit lines is substantially unaffected. Nor is any extra circuit area required, because the third part 21 in FIG. 3 is simply one part of the bit line BLa.

Figure 4:
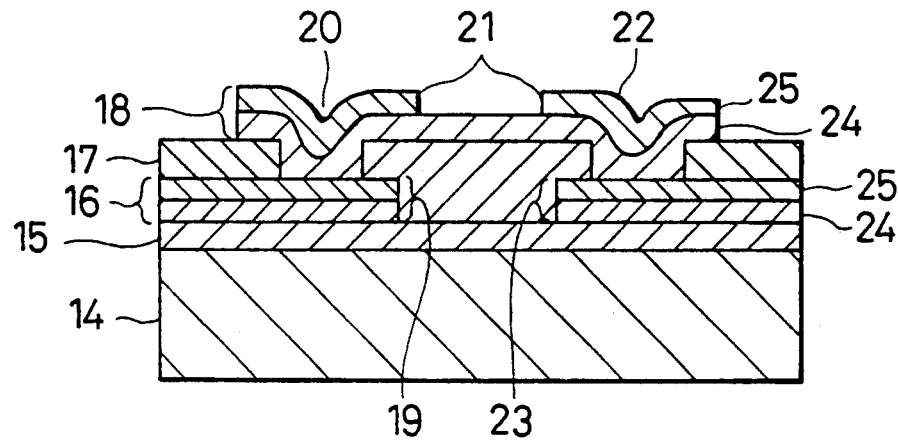
FIG. 4 is a partial sectional view of another semiconductor memory with novel bit lines.

FIG. 4 shows a semiconductor memory with another novel type of bit line. The semiconductor substrate 14 and insulating layers 15 and 17 are the same as in FIG. 3, and the same reference numerals 19 to 23 are used to identify the first to fifth parts of the bit line. The first and second metalization layers 16 and 18 comprise two sublayers: an aluminum alloy sublayer 24, and a conductive sublayer 25 comprising a different material. This conductive sublayer 25 is selectively removed from the third part 21 of the bit line, thereby lowering its electromigration resistance. Electrical resistance remains low because the aluminum-alloy sublayer 24 is left intact. The function of the bit line in FIG. 4 is the same as in FIG. 3, so further description will be omitted.

Figure 5:
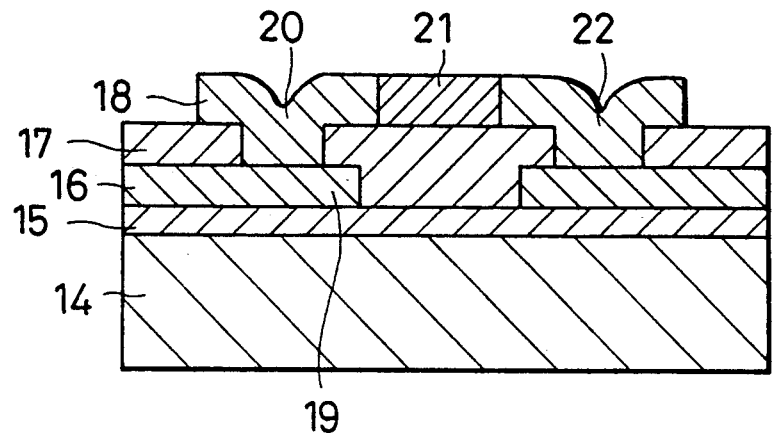
FIG. 5 is a partial sectional view of yet another semiconductor memory with novel bit lines.

FIG. 5 illustrates yet another novel type of bit line, using the same reference numerals as in FIG. 3. In this case the third part 21 of the bit line is narrowed, being not more than half as wide as other parts of the bit line. Susceptibility to electromigration is therefore increased in the third part 21 and the same functions and benefits are obtained as in FIG. 3.

Figure 6:
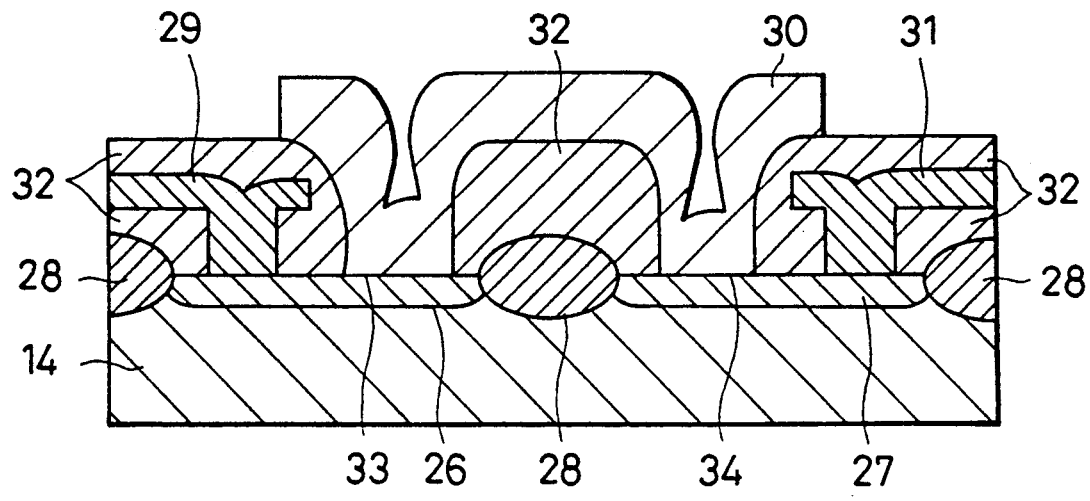
FIG. 6 is a partial sectional view of still another semiconductor memory with novel bit lines.

FIG. 6 illustrates still another novel type of bit line. In this case the semiconductor substrate has lightly-doped n-type areas 26 and 27 created, for example, by ion implantation with a surface density not exceeding $2 \times 10^{20}$ ions per cubic centimeter. These areas are electrically isolated from one another and from other active areas by a plurality of isolation areas 28 formed, for example, by oxidation.

The bit line in FIG. 6 has three parts: a first part 29 comprising a conductive material other than an aluminum alloy, that crosses the word lines in FIG. 1 or FIG. 2 and makes contact with the lightly-doped n-type area 26; a second part 30 comprising an aluminum alloy, that makes contact with the lightly-doped n-type area 26, crosses the isolation area 28 in the center of FIG. 6, and makes contact with the lightly-doped n-type area 27; and a third part 31 comprising a conductive material other than an aluminum alloy, that makes contact with the lightly-doped n-type area 27 and is coupled to the equalizer 3 in FIG. 1 or 2. The first, second, and third parts 29, 30, and 31 of the bit line are isolated from one another by an insulating material 32 such as silicon dioxide. The bit line is thus a series circuit comprising the first part 29, the lightly-doped n-type area 26, the second part 30, the lightly-doped n-type area 27, and the third part 31.

During burn-in, if the bit line in FIG. 6 is shorted to a word line, it carries a current of substantially five hundred microamperes as noted above, and the resulting current stress increases the electrical resistance at the contacts 33 and 34 between the second part 30 and the lightly-doped n-type areas 26 and 27. The mechanism by which this increase occurs has been described in a 1987 technical paper of the Institute of Electronics, Information, and Communication Engineers of Japan (R87-33, pp. 1-6), and involves such factors as electromigration of aluminum atoms into the lightly-doped n-type areas.

If the bit line is not shorted, it carries a current of only about one microampere during burn-in, which is not enough to affect electrical resistance at the contacts 33 and 34 with the lightly-doped n-type areas 26 and 27. Benefits similar to those in FIGS. 3 to 5 are therefore obtained, and the bit line in FIG. 6 is particularly economical of space because the contacts 33 and 34 can also function as interconnections to transistors.

Figure 7:
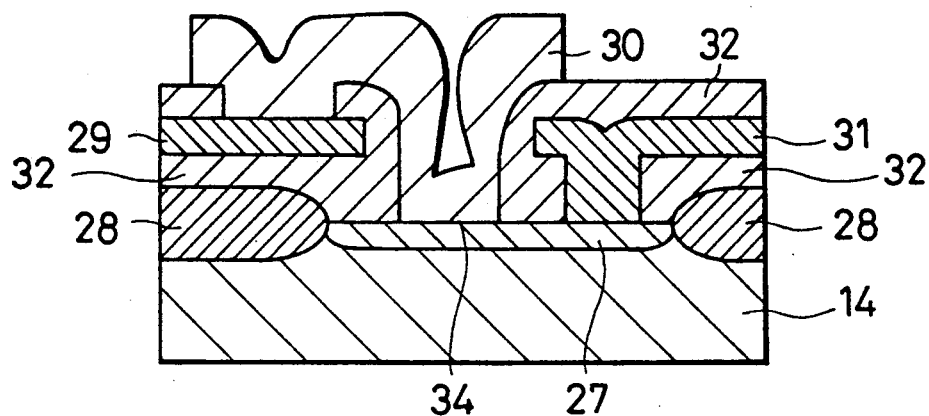
FIG. 7 is a partial sectional view of yet another semiconductor memory with novel bit lines.

FIG. 7 shows a similar type of bit line, using the same reference numerals as in FIG. 6. The third part 32 of this bit line makes contact with the lightly-doped n-type area 27 and the second part 30 couples this lightly-doped n-type area 27 directly to the first part 29 of the bit line, which crosses the word lines. Once again, if the bit line is shorted, the resistance of the contact 34 between the second part 30 and the lightly-doped n-type area 27 will increase greatly during burn-in. The second part 30 comprises an aluminum alloy while the first and third parts 29 and 31 comprises another conductive material, as in FIG. 6.

Figure 8:
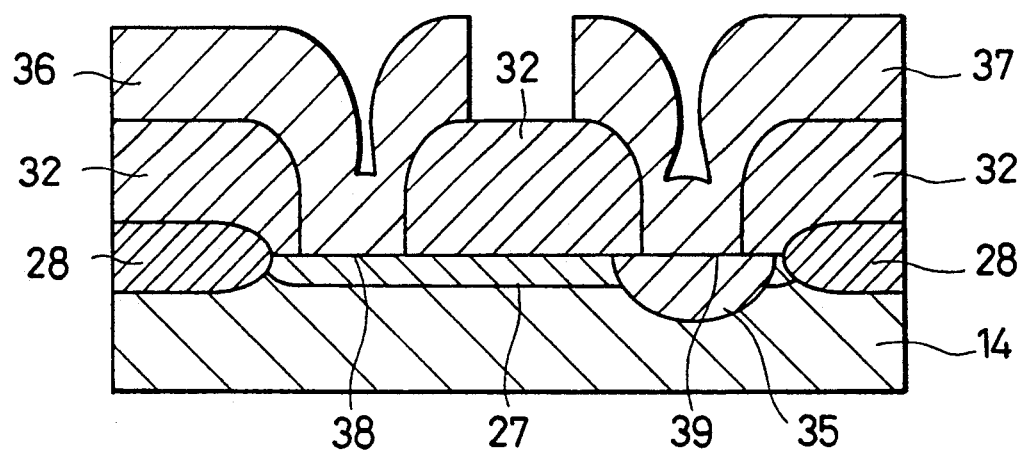
FIG. 8 is a partial sectional view of still another semiconductor memory with novel bit lines.

FIG. 8 shows still another novel type of bit line. As in FIGS. 6 and 7, the substrate 14 has isolation areas 28 with a lightly-doped n-type area 27 in between. A heavily-doped n-type area 35 is formed in one end of the lightly-doped n-type area 27. The heavily-doped n-type area 35 can be created, for example, by ion implantation with a surface density of at least $3 \times 10^{20}$ ions per cubic centimeter.

The bit line in FIG. 8 has a first part 36 and a second part 37, both comprising an aluminum alloy, which are separated by insulating material 32. The first part 36, which crosses the word lines in FIG. 1 or 2, meets the lightly-doped n-type area 27 at a contact 38. The right half, which is coupled to the equalizer 3 in FIG. 1 or 2, meets the heavily-doped n-type area 35 at a contact 39. During burn-in, if the bit line is shorted to a word line, current stress increases the resistance at the contact 38, providing the benefits already described. Because of the higher concentration of impurities in the heavily-doped n-type area 35, aluminum atoms tend to migrate less into this area, so the resistance at the contact 39 can be kept low, as is desirable when the bit line is not shorted.

The first and fifth parts 19 and 23 of the bit line in FIGS. 3 to 5 can be made of a material other than an aluminum alloy, like the first and third parts 29 and 31 in FIGS. 6 and 7. However, the part with low electromigration resistance (the third part 21 in FIGS. 3 to 5, the contacts 33 and 34 in FIG. 6, the contact 34 in FIG. 7, and the contact 38 in FIG. 8) should comprise a material with an intrinsically low electrical resistance, such as an aluminum alloy, to compensate for any increase in resistance caused by electromigration in normal bit lines.

Those skilled in the art will realize that the novel bit lines shown in the drawings can be modified in various other ways without departing from the spirit and scope of the present invention as set forth in the following claims. For example, in FIGS. 3 to 5 the second, third, and fourth parts 20, 21, and 22 of the bit line may all be given a lowered electromigration resistance. If the second metalization layer 18 is formed by sputtering, this can be conveniently done by reducing the sputtering temperature.

What is claimed is:

1. A semiconductor memory comprising a plurality of bit lines, a plurality of word lines, and an equalizer for precharging said bit lines to a fixed potential, wherein each of said plurality of bit lines has a first section crossing said word lines, a second section coupled to said first section, and a third section coupled to said second section and said equalizer, and said second section has a lower electromigration resistance than said first section and said third section.

2. The memory of claim 1, wherein said first section and said third section comprises a first material having a first electrical resistivity, said second section comprises a second material having a second electrical resistivity, and said second electrical resistivity is equal to or less than said first electrical resistivity.

3. The memory of claim 1, wherein said first section, said second section, and said third section comprises an aluminum alloy, and said alloy has a smaller crystal grain size in said second section than in said first section and said third section.

4. The memory of claim 3, wherein said second section has a line width and said aluminum alloy has, in said second section, a crystal grain size not exceeding one-half said line width.

5. The memory of claim 1, wherein each of said plurality of bit lines comprises a layer of an aluminum alloy and a layer of a different conductive material, and said different conductive material is removed in said second section.

6. The memory of claim 1, wherein said first section and said third section have a first line width and said second section has a second line width not exceeding one-half said first line width.

7. The memory of claim 6, wherein said first section, said second section, and said third section comprises an aluminum alloy.

8. A semiconductor memory comprising a plurality of bit lines, a plurality of word lines, an equalizer for precharging said bit lines to a fixed potential, and a semiconductor substrate having a plurality of mutually isolated lightly-doped n-type areas, wherein each of said plurality of bit lines has:
    a first part crossing said word lines and making contact with a first one of said plurality of lightly-doped n-type areas;
    a second part comprising an aluminum alloy, not connected to said first part, but making contact with said first one of said plurality of lightly-doped n-type areas and a second one of said plurality of said lightly-doped n-type areas; and
    a third part, not connected to said first part or said second part, making contact with said second one of said plurality of lightly-doped n-type areas and coupled to said equalizer.

9. The memory of claim 8, wherein said first part and said third part comprise a conductive material other than an aluminum alloy.

10. A semiconductor memory comprising a plurality of bit lines, a plurality of word lines, an equalizer for precharging said bit lines to a fixed potential, and a semiconductor substrate having a plurality of mutually isolated lightly-doped n-type areas, wherein each of said plurality of bit lines has:
    a first part crossing said word lines;
    a second part comprising an aluminum alloy, connected to said first part and making contact with one of said plurality of lightly-doped n-type areas; and
    a third part, not connected to said first part or said second part, making contact with said one of said plurality of lightly-doped n-type areas and coupled to said equalizer.

11. The memory of claim 10, wherein said first part and said third part comprise a conductive material other than an aluminum alloy.

12. A semiconductor memory comprising a plurality of bit lines, a plurality of word lines, an equalizer for precharging said bit lines to a fixed potential, and a semiconductor substrate having a plurality of mutually isolated lightly-doped n-type areas each having a heavily-doped n-type area formed therewithin, wherein each of said plurality of bit lines has:
    a first part comprising an aluminum alloy, crossing said word lines, and making contact with one of said plurality of lightly-doped n-type areas; and
    a second part, coupled to said equalizer, not connected to said first part, but making contact with the heavily-doped n-type area formed within said one of said plurality of lightly-doped n-type areas.

13. The memory of claim 12, wherein said second part comprises an aluminum alloy.

* * * * *